United States Patent [19]

Maeda

[11] Patent Number: 5,353,201

[45] Date of Patent: Oct. 4, 1994

[54] SHIELD DEVICE FOR PRINTED CIRCUIT BOARDS

[75] Inventor: Osamu Maeda, Osaka, Japan

[73] Assignee: Funai Electric Co., Ltd., Osaka, Japan

[21] Appl. No.: 887,070

[22] Filed: May 22, 1992

[30] Foreign Application Priority Data

Nov. 25, 1991 [JP] Japan .............................. 3-104623[U]

[51] Int. Cl.5 ............................................. H05K 9/00
[52] U.S. Cl. ................... 361/816; 174/35 R; 174/35 MS; 361/818
[58] Field of Search .......... 174/35 R, 35 MS, 35 GC, 174/35 TS, 32–33; 439/607–610; 361/424, 816–818; 307/9; 329/318, 349; 333/12; 336/84 R, 84 C; 315/85; 330/68; 331/67; 334/85; 338/64; 343/841; 358/255

[56] References Cited

U.S. PATENT DOCUMENTS

| 4,823,235 | 4/1989 | Suzuki et al. | 174/35 R |
| 5,014,160 | 5/1991 | McCoy Jr. | 174/35 R |
| 5,160,807 | 11/1992 | Fry et al. | 174/35 R |

FOREIGN PATENT DOCUMENTS 2100394  4/1990  Japan .
2237099  9/1990  Japan .
2253698 10/1990  Japan .

Primary Examiner—Bot Ledynh
Attorney, Agent, or Firm—Lackenbach Siegel Marzullo Aronson & Greenspan

[57] ABSTRACT

A shield device for a printed circuit board includes a shield body and a receiving member to be fitted to the shield body which has a plurality of first legs extending perpendicularly to the upper surface of the printed circuit board. The receiving member has a plurality of second legs formed at the corresponding positions to the respective first legs of the shield body to form pairs of first and second legs, each of the pairs of legs penetrating through a slit formed in the printed circuit board, and being joined together. The receiving member can be attached to the shield body by means of simple mechanical engagement, so that the operation therefor becomes much easier.

3 Claims, 2 Drawing Sheets

SHIELD DEVICE FOR PRINTED CIRCUIT BOARDS

THE BACKGROUND OF THE INVENTION

This invention relates to a shield device for printed circuit boards, and more particularly to those comprising upper and lower members which are disposed on the opposite sides of the printed circuit board and connected to each other.

A conventional shield device, as shown in FIG. 1, includes a shield body 2 and a receiving member 3. For obtaining a desired shielding effect for a printed circuit board 1 having a front or upper side 1a on which electronic parts 4, 5 and 6 are fitted and a reverse or lower side 1b, the shield body 2 is disposed on the upper side 1a to cover the desired electronic parts to be shielded, with legs 2a of the shield body 2 penetrating through the printed circuit board 1. The receiving member 3 is placed on the lower side 1b of the printed circuit board 1 and connected to the shield body 2. The legs 2a penetrates through holes formed in the printed circuit board and then through the holes formed in the receiving member 3, the projecting ends thereof being electrically connected to a ground pattern on the printed circuit board and the shield body by means of soldering or welding 7, and also fixed to the receiving member 3 by means of soldering or welding 8.

Therefore, such construction requires a large number of sites to be connected by soldering or welding, resulting in increase in production time and costs.

OBJECT OF THE INVENTION

An object of this invention is to provide a shield device which is capable of being attached to the printed circuit board having electrical parts to be shielded, with a reduced production steps and costs.

SUMMARY OF THE INVENTION

According to this invention, there is provided a shield device for printed circuit board comprising:

a shield body having a plurality of first legs extending perpendicularly to the upper surface of said printed circuit board;

a receiving member having a plurality of second legs formed at the corresponding positions to the respective first legs of said shield body to form pairs of first and second legs;

each of said pairs of legs penetrating through a slit formed in said printed circuit board, and being joined together.

Each pair of the legs of the shield body and the receiving member may be connected to each other by means of engagement of the recess and the projection, so that the operation for attaching the shield body and the receiving member can easily be done.

DETAILED DESCRIPTION

Figure 2:
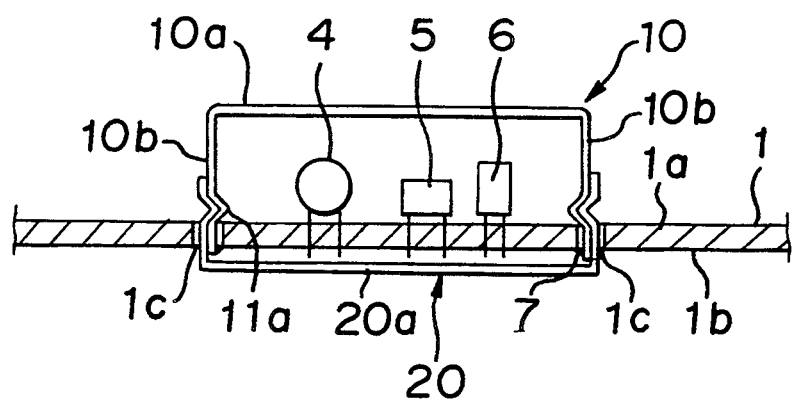
FIG. 2 is a cross sectional view illustrating a printed circuit board and a shield device embodying the present invention.

Referring now to FIG. 2, there is illustrated a shield device embodying the present invention, which comprises a shield body 10 and a receiving member 20, between which a printed circuit board 1 is placed.

Figure 3:
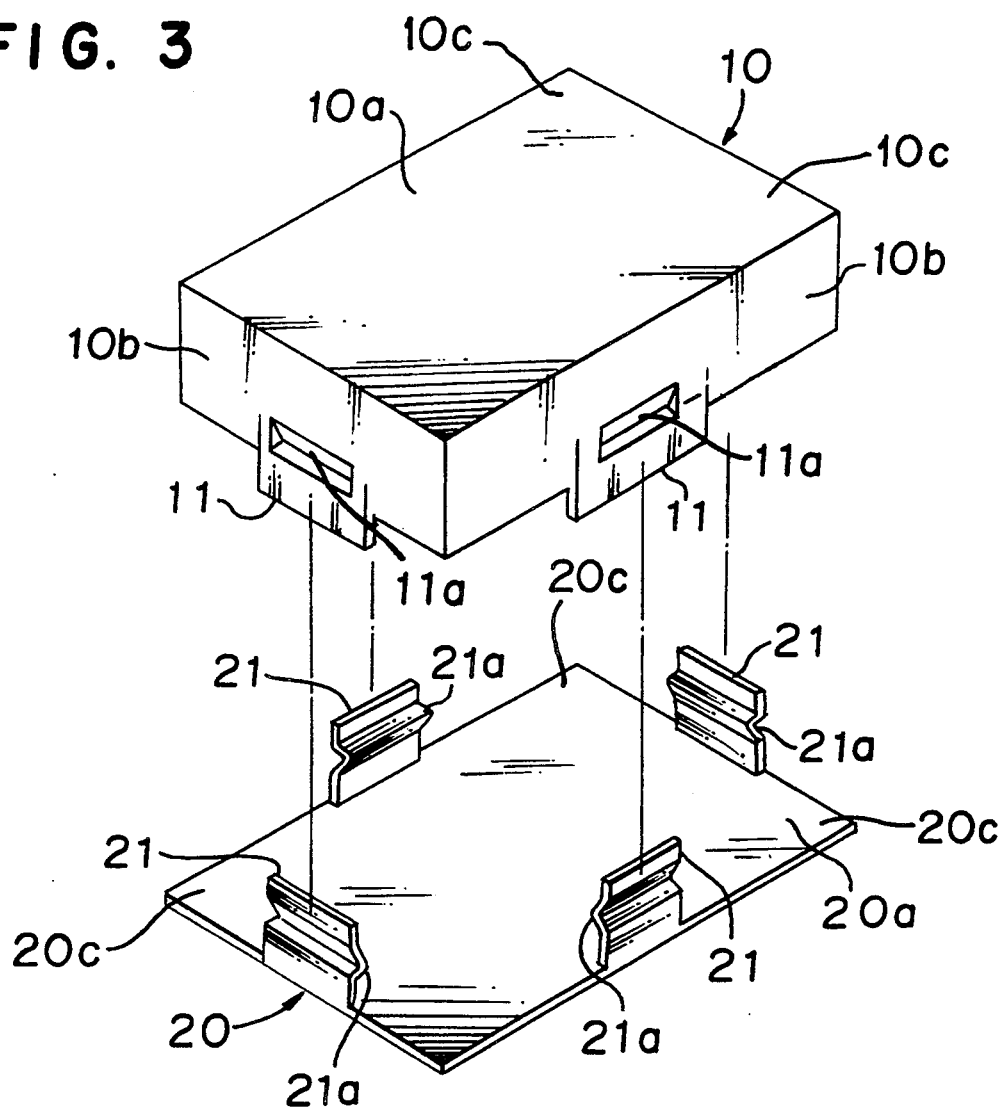
FIG. 3 is an exploded perspective view of the shield device shown in FIG. 2.

As best shown in FIG. 3, the shield body 10 has a top wall 10a facing the upper or working surface 1a of the printed circuit board 1 and four side walls 10b connected to the edges of the top wall to form a substantially rectangular box. It is shown in FIG. 3 that four side walls 10b form four corners. Each of the side walls 10b has an extension or a leg 11 at the edge portion, and a recess 11a in the outer surface of the side wall.

Figure 4:
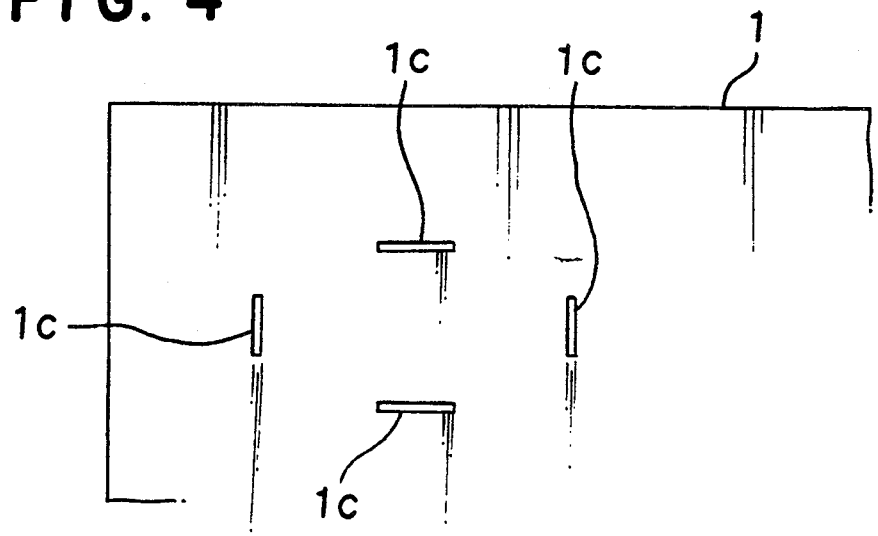
FIG. 4 is a plan view of the printed circuit board to which the shield device is to be equipped.

The printed circuit board 1 is provided with four through holes or slits 1c as shown in FIG. 4, through which the legs 11 and 21 are inserted. On the upper surface 1a of the printed circuit board 1 are fitted electrical parts 4, 5 and 6 to be shielded, which may be resisters, capacitors, transistors or the like.

The receiving member 20 comprises a substantially rectangular plate 20a having approximately same shape and size as the top wall of the shield body 10. From each of the edge of the receiving member, a leg or engaging part 21 projects in the perpendicular direction of the surface of the plate 20a at the corresponding position of each of the legs 11. Each of the engaging parts 21 is provided with a projection formed by bending it, thereby enabling the legs 21 to be joined with the corresponding legs 11 by means of engagement of the recesses 11a and the projections 21a, when the shield body and the receiving member are placed in the predetermined relationship therebetween.

It is illustrated in FIG. 3 that each engaging part 21 extends outwardly from a central portion of the corresponding edge or side of the receiving member. The width of each engaging part expending along said edge or corresponding side is substantially smaller than the length of the side itself. Therefore, each corner area 20c of the receiving member is substantially flat and unobstructed.

The shield body 10 and the receiving member 20 are made of a material having a sufficient magnetic permeability for a desired shielding effect. It is desirable that at least the legs 21 be flexible in order to allow the legs 21 resiliently deformed in the extent that the distal end or tip of the leg 21 can move over the respective projection 11a when the shield body and the receiving member are joined together as shown in FIG. 2.

For the purpose of illustration, four pairs of legs are provided, but the number of the pairs may be two for small shielding devices, or more than four for lager shielding devices.

Figure 1:
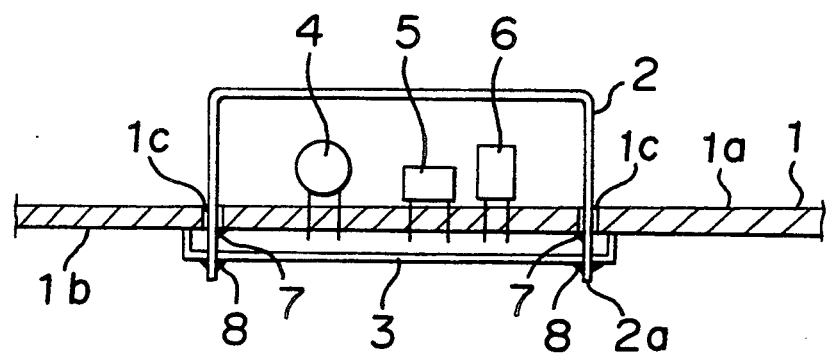
FIG. 1 is a sectional view illustrating a conventional shield device equipped to a printed circuit board.

Referring again to FIG. 1, the shield body 10 is installed on the printed circuit board 1, so that the legs 11 are inserted into the respective slits 1c formed therein, and at least one of the legs 11 is electrically connected to a ground pattern (not shown) formed on the surface 1b of the printed circuit board by means of soldering or welding 7, with leaving the opening in the slits allowing insertion of the legs 21 of the receiving member.

The receiving member 20 is installed by the engagement of the recess 11a and the projection 21a of the legs 21. The operation for installing the receiving member 20 can easily be done by simply inserting the legs 21 into the slits 1c further pushing it until the engagement between the projections and the recesses are completed.

What is claimed is:

1. A device for shielding electronic parts of a printed circuit board comprising:

said printed circuit board having a working surface adjacent to said electronic parts and a plurality of slits passing therethrough;

a shield body having a cover plate and a plurality of side walls, said cover plate and said side walls forming a covering space for covering said electronic parts, a plurality of legs, each leg extending from a side wall and each said leg having a recess and being connected to a group of said printed circuit boards;

a first plate receiving member facing said shield body, said receiving member having a plurality of engaging parts extending therefrom, each said engaging part having a projection engaging said recess of a corresponding leg of said shield body;

said engaging parts and said legs passing through said slits;

said receiving member having a plurality of sides forming a corner area at a junction of two adjacent sides, each said engaging part extending outwardly from a central portion of a corresponding side, the width of each said engaging part extending along said corresponding side and being smaller than the length of said side, whereby each said corner area of said receiving member is flat and unobstructed so as to provide improved cooperation between said shield body, said printed circuit board, and said receiving member; and whereby in an assembled condition of said device, said electronic parts of said printed circuit board are shielded by said shield body in such a manner that said printed circuit board is supported by said receiving member so that said engaging parts passing through said plurality of slits engage said recesses above said working surface of said printed circuit board.

2. A device according to claim 1, wherein said side walls of said shield body form a plurality of corners at an intersection of each said two adjacent side walls, and in the assembled condition of the device, said corners of the shield body are positioned adjacent to the corresponding flat and unobstructed corner area of the receiving member.

3. A device according to claim 2, wherein each said leg extends outwardly from a central portion of a corresponding side wall, so that only one said leg extends from said side wall and only one said engaging part extends from said side, and in the assembled condition of the device each said only one leg is attached to said only one engaging part extending from said central portion of the corresponding side to provide a uniform connection between said shield body and said receiving member.

* * * * *